United States Patent
Dai et al.

(10) Patent No.: US 10,333,546 B2
(45) Date of Patent: Jun. 25, 2019

(54) ENCODER, ENCODING METHOD, DECODER, DECODING METHOD, AND CODEC SYSTEM

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Lei Dai, Beijing (CN); Taehyun Kim, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

(*) Notice: Subject to any disclaimer, the term of this patent is extended or adjusted under 35 U.S.C. 154(b) by 287 days.

(21) Appl. No.: 15/214,353

(22) Filed: Jul. 19, 2016

(65) Prior Publication Data
US 2017/0264906 A1  Sep. 14, 2017

(30) Foreign Application Priority Data
Mar. 10, 2016 (CN) .......................... 2016 1 0137574

(51) Int. Cl.
*H04B 14/04* (2006.01)
*H03M 5/00* (2006.01)
*G09G 5/00* (2006.01)
*H03M 5/12* (2006.01)

(52) U.S. Cl.
CPC .............. *H03M 5/00* (2013.01); *G09G 5/006* (2013.01); *H03M 5/12* (2013.01)

(58) Field of Classification Search
CPC ............ H03M 5/00; H03M 5/12; H03M 1/00; H03M 2201/4233; H03M 2201/196; G09G 5/006; H04L 25/4927; H04B 14/04
USPC .................................. 375/242, 316, 295, 219
See application file for complete search history.

(56) References Cited

U.S. PATENT DOCUMENTS 3,646,550 A * 2/1972 Anacker ................. H03M 7/00
                                                               341/106

* cited by examiner

*Primary Examiner* — Zewdu A Kassa
(74) *Attorney, Agent, or Firm* — Womble Bond Dickinson (US) LLP

(57) ABSTRACT

The present disclosure relates to an encoder and an encoding method thereof, as well as a decoder and a decoding method thereof, which can be used to reduce the number of wires necessary for data transmission and transmit more data at a faster speed with the same number of wires, thereby improving the efficiency of data transmission. The encoder may comprises two input terminals configured to receive two input signals simultaneously, each input terminal comprises a wire identifying a positive voltage and a wire identifying a negative voltage; and a plurality of output terminals, wherein each output terminal comprises a wire identifying a positive voltage and a wire identifying a negative voltage, a combination of the two input signals corresponds to one of the plurality of output terminals, and the output terminal to which the current combination of the two input signals corresponds is configured to output signals through the two wires of the output terminal.

9 Claims, 3 Drawing Sheets

ENCODER, ENCODING METHOD, DECODER, DECODING METHOD, AND CODEC SYSTEM

RELATED APPLICATIONS

The present application claims the benefit of Chinese Patent Application No. 201610137574.2, filed on Mar. 10, 2016, the entire disclosure of which is incorporated herein by reference.

TECHNICAL FIELD

The present disclosure relates to the field of display technology, and more particularly to an encoder and an encoding method thereof, a decoder and a decoding method thereof, as well as a codec system.

BACKGROUND ART

With the increasing development of the display industry, displays are gradually and rapidly developing in the direction of large size and high resolution. As a result, the number of pixels in a display panel is increasingly greater, which sets higher and higher requirements on transmission of data signals through interfaces.

Due to physical restrictions of interface speed, the only way to satisfy a higher speed requirement is to increase the number of interfaces. However, addition of pins of connecting wires will lead to increased costs, and on the other hand, the increased wire number on the substrates of Printed Circuit Boards (PCB) and Flexible Printed Circuit Boards (FPC) will enlarge the area occupied by the display panel.

From the perspective of the characteristics of Metal Oxide Semiconductors (MOS) Field Effect Transistor, it is easier to achieve data processing in integrated circuits (IC) by employing a binary system which uses two digits 0 and 1 to represent data. If an M-ary system is employed to process data, similar circuits are required. However, it may render the circuits complicated and give rise to problems, such as a fault current due to noise and switching speed problem caused by high voltage, etc. Therefore, a binary system of a conventional MOS is usually used.

Moreover, one wire in a conventional interface can only output one binary datum. However, in the course of high speed data transmission, a wire will transmit 1 and 0 repeatedly, which will consume more currents and render the waveforms distorted, and meanwhile transmit fault signals due to noises. Therefore, a Mobile Industry Processor Interface (MIPI) is proposed. For instance, with reference to FIG. 1, when transmitting data by MIPI, a pair of clock lines CLK(+)/(−) and four pairs of wires D0, D1, D2, D3 are required so as to transmit display data and command set, wherein D0, D1, D2, D3 respectively comprise a pair of wires that represent a positive voltage (+) and a negative voltage (−) respectively. When the wire (+) is a positive voltage, and the wire (−) is a negative voltage, it represents that the binary display data is 1; and when the wire (+) is a negative voltage, and the wire (−) is a positive voltage, it represents that the binary display data is 0. In the prior art, such method is employed to transmit the data to a timing controller.

As can be seen from the processing method of FIG. 1, a set of wires can process one-bit data, and four sets of wires can process 4-bit data. Normally, the 8-bit data we usually use need to be processed twice by four sets of wires. In the prior art data transmission method, the number of wires required during data transmission is relatively large, which reduces the efficiency of data transmission.

SUMMARY

To solve the above problems in the prior art, it is desired in the art to provide an encoder and an encoding method thereof, a decoder and a decoding method thereof, as well as a codec system, so as to reduce the number of wires necessary for data transmission and transmit more data at a faster speed with the same number of wires, thereby improving the efficiency of data transmission.

According to one aspect, there is provided an encoder. The encoder comprises two input terminals, wherein the two input terminals are configured to receive two input signals simultaneously; and a plurality of output terminals, wherein each of the output terminals comprises a wire identifying a positive voltage and a wire identifying a negative voltage, a combination of the two input signals corresponds to one of the plurality of output terminals, and the output terminal, to which the current combination of the two input signals corresponds, is configured to output signals through the two wires of the output terminal.

In an embodiment, the two input signals comprise two-bit binary data composed of 0 and/or 1, including 00, 01, 10 or 11.

In an embodiment, the plurality of output terminals comprise four output terminals. If the two input signals are 00, a first output terminal is configured to output low level signals in both the wire identifying a positive voltage and the wire identifying a negative voltage. If the two input signals are 01, a second output terminal is configured to output a low level signal in the wire identifying a positive voltage and a high level signal in the wire identifying a negative voltage. If the two input signals are 10, a third output terminal is configured to output a high level signal in the wire identifying a positive voltage and a low level signal in the wire identifying a negative voltage. If the two input signals are 11, a fourth output terminal is configured to output high level signals in both the wire identifying a positive voltage and the wire identifying a negative voltage.

In an embodiment, the plurality of output terminals comprise three output terminals. If the two input signals are 00, a first output terminal is configured to output low level signals in the wire identifying a positive voltage and the wire identifying a negative voltage. If the two input signals are 01, a second output terminal is configured to output a low level signal in the wire identifying a positive voltage and a high level signal in the wire identifying a negative voltage. If the two input signals are 10, a third output terminal is configured to output a high level signal in the wire identifying a positive voltage and a low level signal in the wire identifying a negative voltage.

According to another aspect, there is provided an encoding method of any of the encoders as stated above. The encoding method comprises the steps of: in a time frame: receiving two input signals simultaneously by two input terminals; determining one of a plurality of output terminals that corresponds to the two input signals according to the two input signals and outputting signals through a wire identifying a positive voltage and a wire identifying a negative voltage of the output terminal.

In an embodiment, the two input signals comprise two-bit binary data composed of 0 and/or 1, including 00, 01, 10 or 11.

In an embodiment, the output terminals of the outputting signals, to which the two different input signals correspond, are different.

In an embodiment, the plurality of output terminals comprise four output terminals. The step of determining one output terminal that corresponds to the two input signals and outputting signals through the wire identifying a positive voltage and the wire identifying a negative voltage of the output terminal comprises:

if the two input signals are 00, outputting low level signals in both the wire identifying a positive voltage of a first output terminal and the wire identifying a negative voltage thereof;

if the two input signals are 01, outputting a low level signal in the wire identifying a positive voltage of a second output terminal and a high level signal in the wire identifying a negative voltage thereof;

if the two input signals are 10, outputting a high level signal in the wire identifying a positive voltage of a third output terminal and a low level signal in the wire identifying a negative voltage thereof; and if the two input signals are 11, outputting high level signals in both the wire identifying a positive voltage of a fourth output terminal and the wire identifying a negative voltage thereof.

In an embodiment, the plurality of output terminals comprise three output terminals. The step of determining one output terminal that corresponds to the two input signals and outputting signals through the wire identifying a positive voltage and the wire identifying a negative voltage of the output terminal further comprises:

if the two input signals are 00, outputting low level signals in the wire identifying a positive voltage of a first output terminal and the wire identifying a negative voltage thereof;

if the two input signals are 01, outputting a low level signal in the wire identifying a positive voltage of a second output terminal and a high level signal in the wire identifying a negative voltage thereof; and if the two input signals are 10, outputting a high level signal in the wire identifying a positive voltage of a third output terminal and a low level signal in the wire identifying a negative voltage thereof.

According to another aspect, there is provided a decoder. The decoder comprises two input terminals, wherein the two input terminals are configured to simultaneously receive a voltage signal of a wire identifying a positive voltage and a voltage signal of a wire identifying a negative voltage; and two output terminals, wherein the two output terminals are configured to output two binary data signals determined according to the two voltage signals received by the two input terminals.

In an embodiment, the two input terminals comprise a first input terminal and a second input terminal. The decoder further comprises an ammeter connecting the first input terminal and the second input terminal, a first voltmeter connecting the first input terminal and the ground, and a second voltmeter connecting the second input terminal and the ground.

In an embodiment, when the ammeter reads zero, it can be determined that the two binary data signals are 00 or 11; when the ammeter reads negative, it can be determined that the two binary data signals are 01; and when the ammeter reads positive, it can be determined that the two binary data signals are 10.

In an embodiment, when the ammeter reads zero and the first voltmeter or the second voltmeter reads a low level, it can be determined that the two binary data signals are 00; and when the ammeter reads zero and the first voltmeter or the second voltmeter reads a high level, it can be determined that the two binary data signals are 11.

According to another aspect, there is provided a decoding method. The decoding method comprises the steps of: in a time frame: receiving a voltage signal of a wire identifying a positive voltage and a voltage signal of a wire identifying a negative voltage; and determining the output signals of two binary data according to the voltage signals and outputting the output signals of the two binary data through two output terminals.

In an embodiment, the step of determining the output signals of the two binary data according to the voltage signals comprises:

determining the output signals as 00 or 11 when the voltage signal of the wire identifying a positive voltage is equal to the voltage signal of the wire identifying a negative voltage;

determining the output signals as 01 when the voltage signal of the wire identifying a positive voltage is less than the voltage signal of the wire identifying a negative voltage; and determining the output signals as 10 when the voltage signal of the wire identifying a positive voltage is greater than the voltage signal of the wire identifying a negative voltage.

In an embodiment, the step of determining the output signals as 00 or 11 when the voltage signal of the wire identifying a positive voltage is equal to the voltage signal of the wire identifying a negative voltage further comprises:

determining the output signals as 00 when the voltage signal of the wire identifying a positive voltage and the voltage signal of the wire identifying a negative voltage are a low level; and determining the output signals as 11 when the voltage signal of the wire identifying a positive voltage and the voltage signal of the wire identifying a negative voltage are a high level.

According to another aspect, there is provided a codec system. The codec system can comprise any one of the encoders as stated above and any one of the decoders as stated above.

The embodiments of the present disclosure can achieve at least one advantageous effect of the following advantageous effects and/or other advantageous effects:

in the encoder and the encoding method thereof, the decoder and the decoding method thereof, as well as the codec system, in a time frame, two input signals are received simultaneously, and signals are outputted at one output terminal, i.e., an 8-bit data transmission can be achieved by only 8 wires. In the prior art, however, in a time frame, one input signal is received, and signals are outputted at one output terminal, i.e., 16 wires are required to achieve 8-bit data transmission. Apparently, the above embodiment reduces the number of wires necessary for data transmission, and can transmits more data at a faster speed with the same number of wires, which improve the efficiency of data transmission.

BRIEF DESCRIPTION OF DRAWINGS

To explain the technical solutions of the embodiments more clearly, the drawings to be used in the Detailed Description will be briefly introduced below. It should be realized that the drawings in the following description are only related to some embodiments. Those skilled in the art can further obtain other drawings that fall within the scope of the present invention according to these drawings without making an inventive labour.

DETAILED DESCRIPTION

To assist those skilled in the art in better understanding the object, technical solutions and advantages of some embodiments more clearly, these embodiments will be further described in detail with reference to the drawings and the specific implementations. Those skilled in the art can understand the embodiments described herein are only a part, not the entirety, of the embodiments of the present invention. Based on the embodiments described herein, those skilled in the art can acquire other embodiments without making an inventive labour. All of these embodiments fall within the scope of protection of the present invention.

An encoder and an encoding method thereof, a decoder and a decoding method thereof, as well as a codec system, are provided according to some embodiments, so as to reduce the number of wires necessary for data transmission and transmit more data at a faster speed with the same number of wires, thereby improving the efficiency of data transmission.

The specific embodiments of the encoder and the encoding method thereof, the decoder and the decoding method thereof, as well as the codec system, will be explained in detail with reference to the drawings below.

What needs to be explained is that the wires used for data transmission in the prior art are divided into a wire (+) identifying a positive voltage and a wire (−) identifying a negative voltage, wherein two wires can assume a positive voltage +Vdd and a negative voltage −Vdd. That is to say, 8 wires are divided into four sets with each set of the wires comprising a wire identifying a positive voltage and a wire identifying a negative voltage, wherein each set of wires corresponds to an output terminal.

Figure 1:
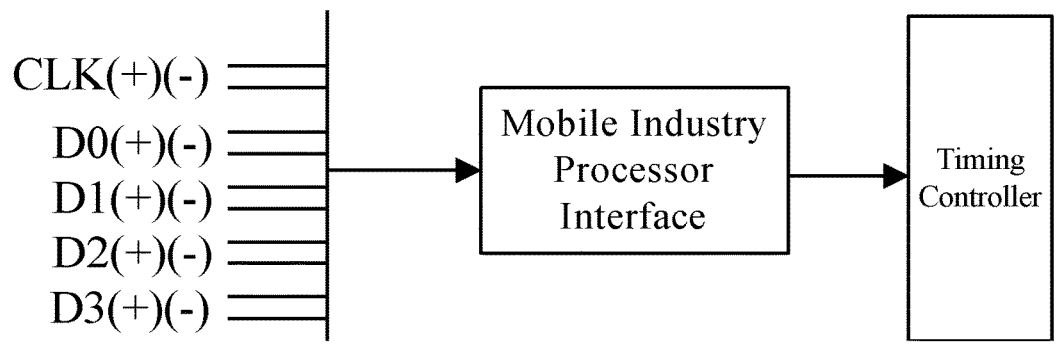
FIG. 1 is a schematic view of a data transmission method provided by the prior art.
Figure 2:
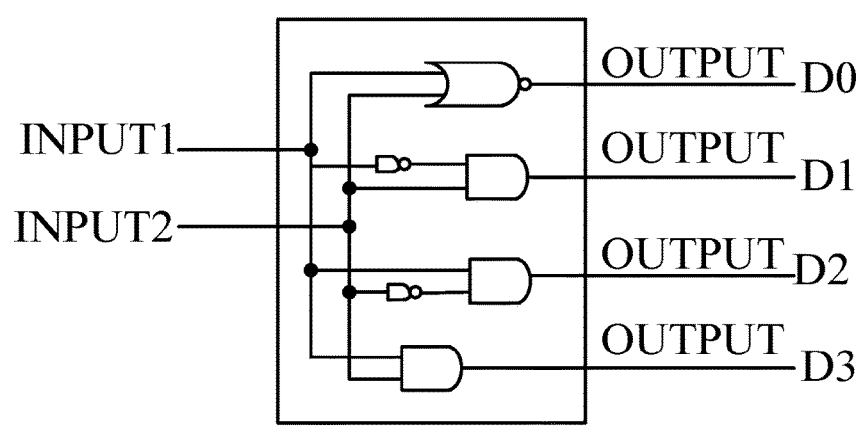
FIG. 2 is a schematic structural view of an encoder provided according to an embodiment.

FIG. 2 illustrates a schematic structural view of an encoder provided according to an embodiment. With reference to FIG. 2, the encoder may comprise two input terminals INPUT and four output terminals OUTPUT, wherein each output terminal can comprise a wire identifying a positive voltage and a wire identifying a negative voltage, and the two input terminals INPUT can be configured to receive two input signals simultaneously. Any one combination of the two input signals can correspond to one output terminal of the four output terminals. The output terminal to which the two input signals correspond can be determined according to the two input signals. The determined output terminal to which the current combination of the two input signals corresponds is configured to output signals through the two wires of the output terminal.

In an embodiment, with reference to FIG. 2, the two input terminals INPUT are respectively referred to as a first input terminal INPUT1 and a second input terminal INPUT2, and the four output terminals OUTPUT are respectively referred to as D0, D1, D2 and D3. In an embodiment, the two input signals comprise two-bit binary data composed of 0 and/or 1, including 00, 01, 10 or 11. The encoder determines one output terminal out of D0, D1, D2 and D3 according to the two binary data received by the input terminals INPUT 1 and INPUT 2 and outputs data by the determined output terminal.

For instance, as shown in FIG. 2, if the two input signals are 00, then a high level is outputted at a first output terminal D0 of the encoder by a logical NOR operation, meaning that the first output terminal D0 is selected, thus it can be determined that the first output terminal D0 should be selected, which is configured to output low level signals in both the wire identifying a positive voltage and the wire identifying a negative voltage. If the two input signals are 01, then a high level is outputted at a second output terminal D1 of the encoder by a logical NOT operation and a logical AND operation, meaning that the second output terminal D1 is selected, thus it can be determined that the second output terminal D1 should be selected, which is configured to output a low level signal in the wire identifying a positive voltage and a high level signal in the wire identifying a negative voltage. If the two input signals are 10, then a high level is outputted at a third output terminal D2 of the encoder by a logical NOT operation and a logical AND operation, meaning that the third output terminal D2 is selected, thus it can be determined that the third output terminal D2 should be selected, which is configured to output a high level signal in the wire identifying a positive voltage and a low level signal in the wire identifying a negative voltage. If the two input signals are 11, then a high level is outputted at a fourth output terminal D3 of the encoder by a logical AND operation, meaning that the fourth output terminal D3 is selected, thus it can be determined that the fourth output terminal D3 should be selected, which is configured to output high level signals in the wire identifying a positive voltage and the wire identifying a negative voltage.

It needs to be pointed out that a low level signal and a high level signal are a pair of relative concepts. For example, both a high level signal and a low level signal can comprise voltage signals, but the high level signal is a voltage signal that is higher than the low level signal. To be more specific, the low level signal can comprise a negative voltage signal, a zero voltage signal or a smaller positive voltage signal.

In an embodiment, signals are outputted at different output terminals according to the two input signals of the input terminals. When selected via the output of a high level, different output terminals output different signals through the corresponding wire identifying a positive voltage and the corresponding wire identifying a negative voltage thereof. For instance, if the output terminal, to which the first output terminal D0 corresponds, outputs a high level to mean being selected, both the wire identifying the positive voltage and the wire identifying the negative voltage of the first output terminal output low level signals, i.e., being represented as quaternary data termed 0. If the second output terminal D1 of the encoder outputs a high level to mean being selected, the wire identifying the positive voltage of the second output terminal outputs a low level signal and the wire identifying the negative voltage thereof outputs a high level signal, i.e., being represented as quaternary data termed 1. If the third output terminal D2 of the encoder outputs a high level to mean being selected, the wire identifying the positive voltage of the third output terminal outputs a high level signal and the wire identifying the negative voltage thereof outputs a low level signal, i.e., being represented as quaternary data termed 2. If the fourth output terminal D3 of the encoder outputs a high level to mean being selected, both the wire identifying the positive voltage and the wire identifying the negative voltage of the fourth output terminal output high level signals, i.e., being represented as quaternary data termed 3. Thus, the encoder provided by the embodiment transmits data by means of a quaternary system, and the number of wires necessary for data transmission is less than that in the prior art.

Alternatively, if the two input signals are 00, it can be determined that the first output terminal D0 should be selected and configured to output low level signals in both the wire identifying a positive voltage and the wire identifying a negative voltage. If the two input signals are 01, it can be determined that the second output terminal D1 should be selected and configured to output a low level signal in the wire identifying a positive voltage and a high level signal in the wire identifying a negative voltage. If the two input signals are 10, it can be determined that the third output terminal D2 should be selected and configured to output a high level signal in the wire identifying a positive voltage and a low level signal in the wire identifying a negative voltage.

To be specific, if 0 is inputted at both the first input terminal and the second input terminal, the first output terminal outputs a high level which indicates that the first output terminal is selected, and both the wire identifying a positive voltage and the wire identifying a negative voltage of the first output terminal output low level signals. If the input signal of the first input terminal is 0 and the input signal of the second input terminal is 1, the second output terminal D1 of the encoder outputs a high level which indicates that the second output terminal D1 is selected, then the wire identifying a positive voltage of the second output terminal outputs a low level signal, and the wire identifying a negative voltage thereof outputs a high level signal. If the input signal of the first input terminal is 1 and the input signal of the second input terminal is 0, the third output terminal D2 of the encoder outputs a high level which indicates that the third output terminal D2 is selected, then the wire identifying a positive voltage of the third output terminal outputs a high level signal, and the wire identifying a negative voltage thereof outputs a low level signal.

In a specific embodiment, signals are outputted at different output terminals according to the two input signals of the input terminals. When selected via the output of a high level, different output terminals output different signals through the corresponding wire identifying a positive voltage and the corresponding wire identifying a negative voltage thereof. For instance, if the output terminal, to which the first output terminal D0 corresponds, outputs a high level to mean being selected, both the wire identifying the positive voltage and the wire identifying the negative voltage of the first output terminal output low level signals, i.e., being represented as ternary data termed 0. If the second output terminal D1 of the encoder outputs a high level to mean being selected, the wire identifying the positive voltage of the second output terminal outputs a low level signal and the wire identifying the negative voltage thereof outputs a high level signal, i.e., being represented as ternary data termed 1. If the third output terminal D2 of the encoder outputs a high level to mean being selected, the wire identifying the positive voltage of the third output terminal outputs a high level signal and the wire identifying the negative voltage thereof outputs a low level signal, i.e., being represented as ternary data termed 2. Thus, the encoder provided by the embodiment transmits data by means of a ternary system, and the number of wires necessary for data transmission is less than that in the prior art.

Thus, in a time frame, the encoder provided by the above embodiment receive two input signals simultaneously, and two wires are used to output signal at one output terminal. If 8-bit binary data needs to be transmitted by means of a quaternary system, only 8 wires are required for such data transmission. However, in the prior art, in a time frame, an input signal is received and a signal is outputted at an output terminal. If 8-bit data signals are transmitted, 16 wires are required to achieve the data transmission. As such, the encoder provided by the above embodiment reduces the number of wires necessary for data transmission, and meanwhile transmits more data at a faster speed with the same number of wires, which improves the efficiency of data transmission.

Figure 3:
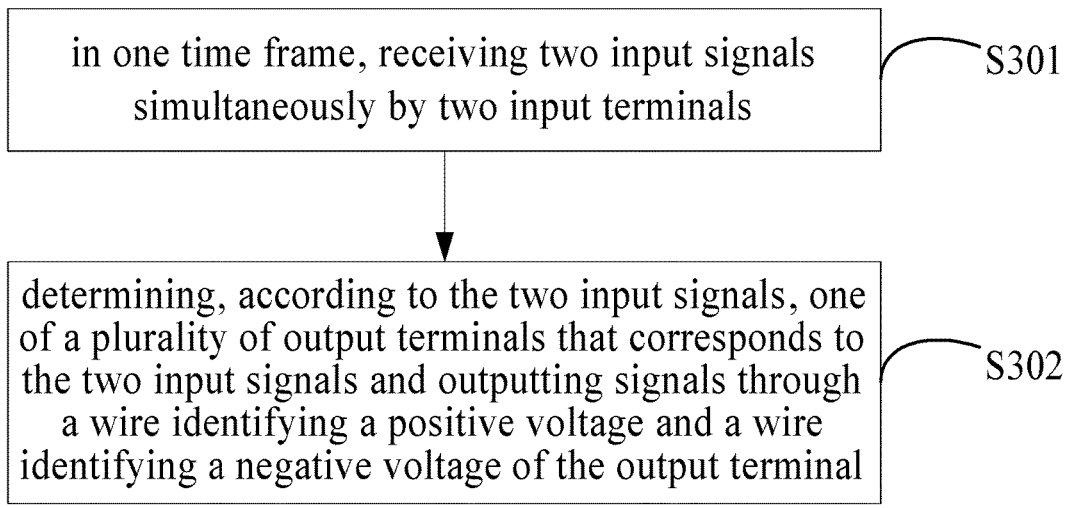
FIG. 3 is a schematic flow chart of an encoding method provided according to an embodiment.

FIG. 3 illustrates a schematic flow chart of an encoding method provided according to an embodiment. The encoding method can be used for the above encoder. With reference to FIG. 3, the encoding method comprises:

S301: in a time frame, receiving two input signals simultaneously by two input terminals;

S302: determining one of a plurality of output terminals that corresponds to the two input signals according to the two input signals and outputting signals through a wire identifying a positive voltage and a wire identifying a negative voltage of the output terminal, wherein each of the output terminals comprises the wire identifying a positive voltage and the wire identifying a negative voltage.

It needs to be explained that the encoding method provided by the above embodiment achieves data transmission by using the M-ary system. To be specific, with reference to Table 1, it shows a exemplary form of the number of output terminals required when data ranging from 0 to 255 are transmitted by a binary system, a ternary system and a quaternary system, wherein 8 output terminals are required when data are transmitted by a binary system, 6 output terminals are required when data are transmitted by a ternary system, and 4 output terminals are required when data are transmitted by a quaternary system. As can be seen, less output terminals and wires are required if data are transmitted by an M-ary system, which can improve the efficiency of data transmission.

TABLE 1

|     |            | D7 | D6 | D5 | D4 | D3 | D2 | D1 | D0 |
|-----|------------|----|----|----|----|----|----|----|----|
| 255 | Binary     | 1  | 1  | 1  | 1  | 1  | 1  | 1  | 1  |
|     | Ternary    |    |    | 1  | 0  | 0  | 1  | 1  | 1  |
|     | Quaternary |    |    |    |    | 3  | 3  | 3  | 3  |
| 233 | Binary     | 1  | 1  | 1  | 0  | 1  | 0  | 0  | 1  |
|     | Ternary    |    |    | 0  | 2  | 2  | 1  | 2  | 2  |
|     | Quaternary |    |    |    |    | 3  | 2  | 2  | 1  |
| 128 | Binary     | 1  | 0  | 0  | 0  | 0  | 0  | 0  | 0  |
|     | Ternary    |    |    | 0  | 1  | 1  | 2  | 0  | 2  |
|     | Quaternary |    |    |    |    | 2  | 0  | 0  | 0  |
| 96  | Binary     | 0  | 1  | 1  | 0  | 0  | 0  | 0  | 0  |
|     | Ternary    |    |    | 0  | 1  | 0  | 1  | 2  | 0  |
|     | Quaternary |    |    |    |    | 1  | 2  | 0  | 0  |

In an embodiment, the two input signals may comprise two-bit binary data composed of 0 and/or 1, including 00, 01, 10 or 11, wherein 0 represents a low level, and 1 represents a high level.

For instance, the input signal received by each input terminal may be 0 or 1, and the input signals received by two input terminals may comprise 00, 01, 10 or 11. For instance, if the input signal is 01, it means the input signal at the first input terminal is 0 and the input signal at the second input terminal is 1. If the input signal is 10, it means the input signal at the first input terminal is 1 and the input signal at the second input terminal is 0. During the data transmission, the input signals received by the input terminals of the encoder are all binary digital signal, and 0 represents a low level, 1 represents a high level.

In an embodiment, the output terminals of the output signals, to which two different input signals correspond, are different. To be specific, different output terminals can be selected to output signals according to different signals at the input terminals, and signals outputted by different output terminals correspond to different binary data. Thus, if, within several adjacent frames, different input signals are inputted, then it is possible to output signals at different output terminals, so as to avoid increased current consumption caused by repeated sending of 1 and 0 by wires during high speed data transmission and resultant waveform distortion, and meanwhile avoid the problem of sending fault signals caused by noise.

In an embodiment, the plurality of output terminals comprise four output terminals. If the two input signals are 00, the first output terminal may be selected to output signal and low level signals are outputted in both the wire identifying a positive voltage and the wire identifying a negative voltage of the first output terminal. If the two input signals are 01, the second output terminal may be selected to output signal and a low level signal is outputted in the wire identifying a positive voltage of the second output terminal and a high level signal in the wire identifying a negative voltage thereof. If the two input signals are 10, the third output terminal may be selected to output signal and a high level signal is outputted in the wire identifying a positive voltage of the third output terminal and a low level signal in the wire identifying a negative voltage thereof. If the two input signals are 11, the fourth output terminal may be selected to output signal and high level signals are outputted in both the wire identifying a positive voltage and the wire identifying a negative voltage of the fourth output terminal.

To be specific, if the input signals at the first input terminal and the second input terminal are both 0, then a high level is outputted at a first output terminal D0 of the encoder, meaning that the first output terminal D0 is selected, and low level signals are outputted in both the wire identifying a positive voltage and the wire identifying a negative voltage of the first output terminal. If the input signal at the first input terminal is 0 and the input signal at the second input terminal is 1, then a high level is outputted at a second output terminal D1 of the encoder, meaning that the second output terminal D1 is selected, and a low level signal is outputted in the wire identifying a positive voltage of the second output terminal and a high level signal in the wire identifying a negative voltage thereof. If the input signal at the first input terminal is 1 and the input signal at the second input terminal is 0, then a high level is outputted at a third output terminal D2 of the encoder, meaning that the third output terminal D2 is selected, and a high level signal is outputted in the wire identifying a positive voltage of the third output terminal and a low level signal in the wire identifying a negative voltage thereof. If the input signals at the first input terminal and the second input terminal are both 1, then a high level is outputted at a fourth output terminal D3 of the encoder, meaning that the fourth output terminal D3 is selected, and high level signals are outputted in both the wire identifying a positive voltage and the wire identifying a negative voltage of the fourth output terminal.

In a specific embodiment, signals are outputted at different output terminals according to the two input signals of the input terminals. When selected via the output of a high level, different output terminals output different signals through the corresponding wire identifying a positive voltage and the corresponding wire identifying a negative voltage thereof. For instance, if the output terminal, to which the first output terminal D0 corresponds, outputs a high level to mean being selected, both the wire identifying the positive voltage and the wire identifying the negative voltage of the first output terminal output low level signals, i.e., being represented as quaternary data termed 0. If the second output terminal D1 of the encoder outputs a high level to mean being selected, the wire identifying the positive voltage of the second output terminal outputs a low level signal and the wire identifying the negative voltage thereof outputs a high level signal, i.e., being represented as quaternary data termed 1. If the third output terminal D2 of the encoder outputs a high level to mean being selected, the wire identifying the positive voltage of the third output terminal outputs a high level signal and the wire identifying the negative voltage thereof outputs a low level signal, i.e., being represented as quaternary data termed 2. If the fourth output terminal D3 of the encoder outputs a high level to mean being selected, both the wire identifying the positive voltage and the wire identifying the negative voltage of the fourth output terminal output high level signals, i.e., being represented as quaternary data termed 3. Thus, the encoding method transmits data by means of a quaternary system, and the number of wires necessary for data transmission is less than that in the prior art.

Alternatively, if the two input signals are 00, the first output terminal is selected and low level signals are outputted in the wire identifying a positive voltage and the wire identifying a negative voltage of the first output terminal. If the two input signals are 01, the second output terminal is selected and a low level signal is outputted in the wire identifying a positive voltage of the second output terminal and a high level signal is outputted in the wire identifying a negative voltage thereof. If the two input signals are 10, the third output terminal is selected and a high level signal is outputted in the wire identifying a positive voltage of the third output terminal and a low level signal in the wire identifying a negative voltage thereof.

To be specific, if 0 is inputted at both the first input terminal and the second input terminal, the first output terminal outputs a high level which indicates that the first output terminal is selected, and both the wire identifying a positive voltage and the wire identifying a negative voltage of the first output terminal output low level signals. If the input signal at the first input terminal is 0 and the input signal at the second input terminal is 1, the second output terminal D1 of the encoder outputs a high level which indicates that the second output terminal D1 is selected, the wire identifying a positive voltage of the second output terminal outputs a low level signal, and the wire identifying a negative voltage thereof outputs a high level signal. If the input signal of the first input terminal is 1 and the input signal of the second input terminal is 0, the third output terminal D2 of the encoder outputs a high level which indicates that the third output terminal D2 is selected, the wire identifying a positive voltage of the third output terminal outputs a high level signal, and the wire identifying a negative voltage thereof outputs a low level signal.

In a specific embodiment, signals are outputted at different output terminals according to the two input signals of the input terminals. When selected via the output of high level, different output terminals output different signals through the corresponding wire identifying a positive voltage and the corresponding wire identifying a negative voltage thereof. For instance, if the output terminal, to which the first output terminal D0 corresponds, outputs a high level to mean being selected, both the wire identifying the positive voltage and the wire identifying the negative voltage of the first output terminal output low level signals, i.e., being represented as ternary data termed 0. If the second output terminal D1 of the encoder outputs a high level to mean being selected, the wire identifying the positive voltage of the second output terminal outputs a low level signal and the wire identifying the negative voltage thereof outputs a high level signal, i.e., being represented as ternary data termed 1. If the third output terminal D2 of the encoder outputs a high level to mean being selected, the wire identifying the positive voltage of the third output terminal outputs a high level signal and the wire identifying the negative voltage thereof outputs a low level signal, i.e., being represented as ternary data termed 2. Thus, the encoding method provided by the embodiment transmits data by means of a ternary system, and the number of wires necessary for data transmission is less than that in the prior art.

Figure 4:
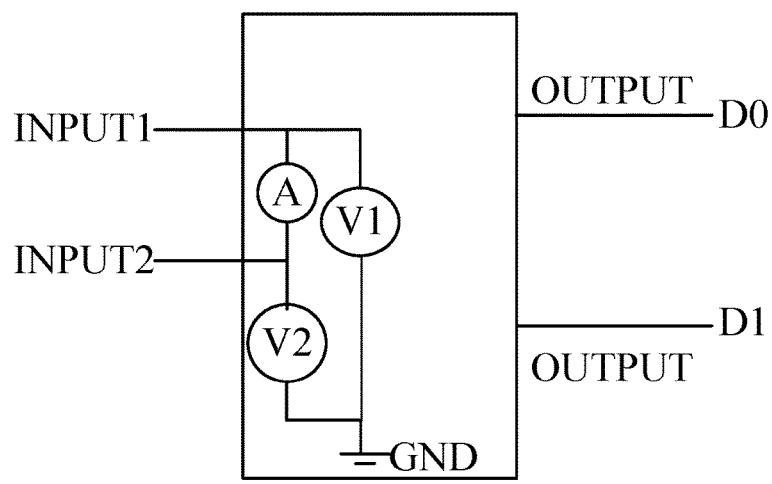
FIG. 4 is a schematic structural view of a decoder provided according to an embodiment.

FIG. 4 illustrates a schematic structural view of a decoder provided according to an embodiment. With reference to FIG. 4, the decoder may comprise two input terminals INPUT and two output terminals OUTPUT. The two input terminals INPUT can be configured to simultaneously receive a voltage signal in the wire identifying a positive voltage and a voltage signal in the wire identifying a negative voltage. The two output terminals OUTPUT can be configured to output two binary data signals determined according to the two voltage signals received by the two input terminals.

With reference to FIG. 4, the two input terminals INPUT can be respectively referred to as a first input terminal INPUT1 and a second input terminal INPUT2, and the two output terminals OUTPUT can be respectively referred to as D0 and D1. The decoder determines binary data to be outputted by D0 and D1 according to the voltage signal in the wire identifying a positive voltage and the voltage signal in the wire identifying a negative voltage inputted by the two input terminals, in such a manner that the decoder achieves the purpose of decoding an M-ary data into binary data.

In an embodiment, with reference to FIG. 4, the decoder as shown may further comprise an ammeter A connecting the first input terminal INPUT 1 and the second input terminal INPUT 2; a first voltmeter V1 connecting the first input terminal INPUT 1 and the ground GND; and a second voltmeter V2 connecting the second input terminal INPUT 2 and the ground GND.

To be specific, the flow direction of currents and the voltage value of the voltage signal can be determined according to the readings of the ammeter A, the first voltmeter V1 and the second voltmeter V2, and then the binary data outputted at the output terminals can be determined accordingly. The specific determining method will be described in detail as follows.

It needs to be noted that the decoders provided according to the above embodiment correspond to the encoders provided by the above embodiments one to one.

Figure 5:
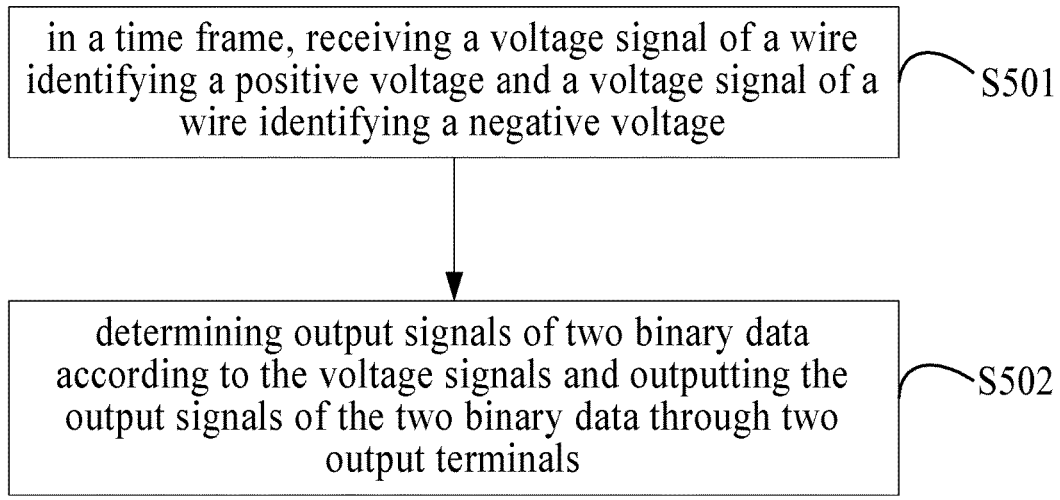
FIG. 5 is a schematic flow chart of a decoding method provided according to an embodiment.

FIG. 5 illustrates a schematic flow chart of a decoding method provided according to an embodiment. With reference to FIG. 5, the decoding method comprises:

S501: in a time frame, receiving a voltage signal of the wire identifying a positive voltage and a voltage signal of the wire identifying a negative voltage;

S502: determining output signals of two binary data according to the voltage signals and outputting the output signals of the two binary data through two output terminals.

It shall be explained that the decoding method of the decoder provided by the above embodiment converts the M-ary data into binary data, thereby achieving data transmission.

In an embodiment, the output signals of the two binary data can be determined according to the voltage signals in the following ways:

if the ammeter reads zero, it can be determined that the output signals are 00 or 11;

if the ammeter reads negative, it can be determined that the output signals are 01;

if the ammeter reads positive, it can be determined that the output signals are 10.

With reference to FIGS. 4 and 5, when the ammeter A reads zero, it indicates that the value of the voltage signal inputted at the first input terminal INPUT1 is equal to that of the voltage signal inputted at the second input terminal INPUT2, such that no voltage is formed across the two terminals of the ammeter, and the ammeter reads zero. For instance, both the voltage signal in the wire identifying a positive voltage and the voltage signal in the wire identifying a negative voltage inputted at the two input terminals are negative, zero or positive. Correspondingly, the data outputted at the output terminals are 00 or 11. When the ammeter A reads negative, it means the value of the voltage signal inputted at the first input terminal INPUT1 is less than that of the voltage signal inputted at the second input terminal INPUT2, such that the currents flow from the second input terminal to the first input terminal, and the ammeter reads negative. For instance, the voltage signal in the wire identifying the positive voltage inputted at the first input terminal INPUT1 is zero or negative, and the voltage signal in the wire identifying the negative voltage inputted at the second input terminal INPUT2 is positive. Correspondingly, the data outputted at the output terminals are 01. When the ammeter A reads positive, it means the value of the voltage signal inputted at the first input terminal INPUT1 is greater than that of the voltage signal inputted at the second input terminal INPUT2, such that the currents flow from the first input terminal to the second input terminal, and the ammeter reads positive. For instance, the voltage signal in the wire identifying the positive voltage inputted at the first input terminal INPUT1 is positive, and the voltage signal in the wire identifying the negative voltage inputted at the second input terminal INPUT2 is zero or negative. Correspondingly, the data outputted at the output terminals are 10. Thus, this method applies to data transmission by means of a ternary system when encoding by an encoder and decoding by a decoder.

In an embodiment, when the ammeter reads zero, the following method can be used to further determine whether the output signals are 00 or 11:

when the ammeter reads zero and the first voltmeter or the second voltmeter reads a low level, e.g., zero or a negative voltage, the output signals are determined as 00; and when the ammeter reads zero and the first voltmeter or the second voltmeter reads a high level, e.g., a positive voltage, the output signals are determined as 11.

Furthermore, with the reference to FIG. 4, the output signals in the circumstances where the ammeter A reads zero can be determined by the readings of the ammeter A, the first voltmeter V1 and the second voltmeter V2. To be specific, when the ammeter A reads zero and the first voltmeter V1 reads a high level (e.g., a positive voltage) or the second voltmeter V2 reads a high level (e.g., a positive voltage), it can be determined that the voltage signals inputted at the first input terminal INPUT1 and the second input terminal INPUT2 are a high level (e.g., a positive voltage), which indicates that the data outputted at the output terminal are 11. When the ammeter A reads zero and the first voltmeter V1 reads a low level (e.g., zero or a negative voltage) or the second voltmeter V2 reads a low level (e.g., zero or a negative voltage), it can be determined that both the voltage signals inputted at the first input terminal INPUT1 and the second input terminal INPUT2 are a low level (e.g., zero or a negative voltage), which indicates that the data outputted at the output terminal are 00. Thus, the method transmits data by means of a quaternary system.

To sum up, both of the decoders and the decoding methods thereof provided by the above embodiment correspond to the encoders and the encoding methods thereof provided by the above embodiments one to one, wherein the encoder transmits the data in need of transmission to the decoder by means of a ternary system or a quaternary system, and the decoder decodes the received data into binary data to complete the data transmission. The decoder determines the data outputted at the output terminal according to the direction of current and the values of the voltages. The direction of current can be relatively easy to determine even in the case of noise, which improves the stability of the decoder.

It needs to be explained that the present disclosure is described in detail by taking the ternary and quaternary encoding and decoding methods as exemplary embodiments, but not limited to the data transmission with ternary and quaternary encoding and decoding methods only. More M-ary systems can be employed for data transmission, which reduces the number of wires occupied by data transmission, and improves the efficiency of data transmission. The embodiments of the present disclosure do not exert any specific limitations thereto.

In an actual application, a host device is a system for controlling other units among multiple integral systems, and a local device is a system particularly for a certain unit. For example, an application processor (AP) in a cellular phone serves as a host device to manage and control a liquid crystal display (LCD), a telematics service provider (TSP), a microphone and a speaker, etc. The units such as LCD and TSP serve as local devices be respectively responsible for image display of LCDs and normal operation of touch-sensitive actions, etc. Thus, for data transmission between devices in a system, the principles and methods of the encoder and the decoder provided by the embodiments of the present disclosure can be used to reduce the number of wires occupied and improve the efficiency of data transmission.

Figure 6:
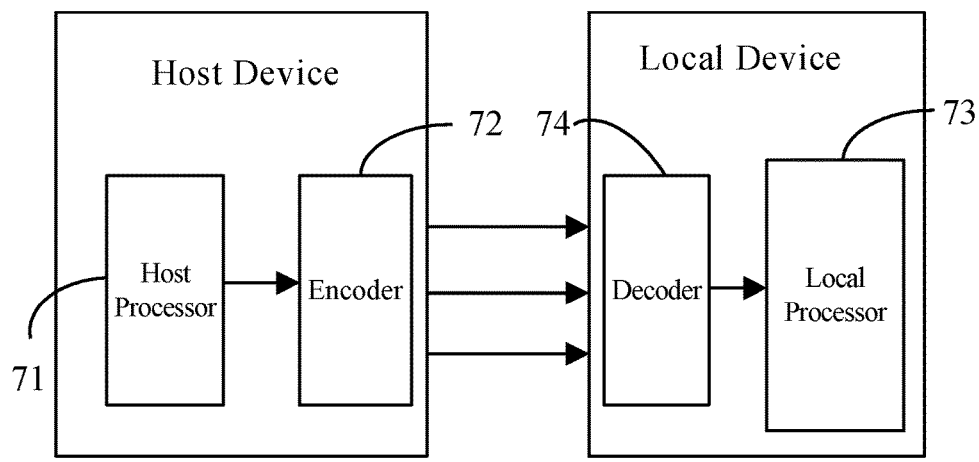
FIG. 6 is a view of a codec system comprising the decoder and the encoder, provided according to an embodiment.

FIG. 6 illustrates a view of a codec system comprising the decoder and the encoder according to an embodiment. With reference to FIG. 6, the host device comprises a host processor 71 and an encoder 72, and the local device comprises a local processor 73 and a decoder 74, wherein both the encoder 72 and the decoder 74 are those provided by the above embodiments. During the data transmission between the encoder and the decoder, the transmission is conducted by an M-ary system in the encoding method and the decoding method provided by the above embodiment, thereby reducing the number of wires occupied for data transmission, simplifying the complexity of circuits and improving the efficiency of data transmission.

In an electronic product, an integrated circuit (IC) only takes a small portion of the area, and the data transmission between devices is mainly achieved on a printed circuit board (PCB). The encoder and decoder provided by the embodiments of the present disclosure can reduce the length and number of signal lines on the PCB, and avoid noise caused by the fact that the area of the PCB occupied by the signal lines is larger than the IC area.

In addition, in order to further avoid noise caused by the fact that the area of the PCB occupied by the signal lines is larger than the IC area, the distance between lines is usually kept at 20 nm when drawing the inner lines of the IC, while the distance between lines on the PCB is 120 um.

In the encoder provided by the embodiment of the present disclosure, in a time frame, two input signals are received at two input terminals simultaneously, and a quaternary signal is outputted at one output terminal. Therefore when 8-bit data signals are transmitted, only 8 wires are required for such data transmission. However, in the prior art, in a time frame, a binary input signal is received and a binary signal is outputted at an output terminal. When 8-bit data signals are transmitted, 16 wires are required to achieve the data transmission. The encoder provided by the above embodiment reduces the number of wires necessary for data transmission, and transmits more data at a faster speed with the same number of wires, which improve the efficiency of data transmission.

It can be understood that the above embodiments are only exemplary embodiments of the present invention, but the protective scope of the present invention is not limited thereto. Those skilled in the art can make various modifications and variations of the embodiments without departing from the spirit and scope of the present invention. If these modifications and variations are within the scope of the appended claims and the equivalents thereof, the invention is meant to include these modification and variation. The protection scope of the present invention shall be based on the protection scope of the appended claims.

What needs to be explained is that the above embodiments are only illustrated by way of the above individual functional modules division. In actual application, the above functions can be allocated to different functional modules as desired. The internal structure of the device can be divided into different functional modules so as to accomplish all or part of the functions as stated above. In addition, function(s) of the above one module can be achieved by a plurality of modules, and functions of the above plurality of modules can be integrated into one module.

The term "and/or" used herein is only used to describe the connecting relations between objects connected thereby, which may be of three types. For instance, "A and/or B" can represent the following three situations: either A alone, or B alone, or both A and B. In addition, the character "/" used herein generally indicates that the former and the latter objects connected thereby is in a "or" relationship.

The present application uses wordings such as "first", "second" and "third". Unless specified in the context, the use of such wordings does not imply any ordering, but these wordings are actually used only for the purpose of identification. For instance, the phrases "a first output terminal" and "a second output terminal" do not necessarily mean that the first output terminal is located in front of the second output terminal, or the first output terminal is more important than the second output terminal, or the first output terminal is operated or processed prior to the second output terminal in terms of time. In fact, these phrases are only used to identify different output terminals.

In the claims, any reference sign in parentheses should not be interpreted as a limitation to the claims. The term "comprise/include" does not exclude the presence of elements or steps other than those listed in the claims. The article "a" or "an" in front of elements do not exclude the presence of a plurality of such elements. The present invention may be achieved by means of hardware comprising several separate elements, or by properly programmed software or firmware, or by any combination thereof.

In device or system claims that enumerate several means, one or more of the means can be embodied in one and the same item of hardware. The mere fact that some measures are recited in mutually different dependent claims does not indicate that the combination of the measures cannot be used to advantage.

What is claimed is:

1. An encoder comprising:
two input terminals, wherein the two input terminals are configured to receive two input signals simultaneously; and
a plurality of output terminals, wherein each of the output terminals comprises a wire identifying a positive voltage and a wire identifying a negative voltage, a combination of the two input signals corresponds to one of the plurality of output terminals, and the output terminal to which the current combination of the two input signals corresponds is configured to output signals through the two wires of the output terminal.

2. The encoder according to claim 1, wherein the two input signals comprise two-bit binary data composed of 0 and/or 1, including 00, 01, 10 or 11.

3. The encoder according to claim 2, wherein the plurality of output terminals comprise four output terminals,
if the two input signals are 00, a first output terminal is configured to output low level signals in both the wire identifying a positive voltage and the wire identifying a negative voltage;
if the two input signals are 01, a second output terminal is configured to output a low level signal in the wire identifying a positive voltage and a high level signal in the wire identifying a negative voltage;
if the two input signals are 10, a third output terminal is configured to output a high level signal in the wire identifying a positive voltage and a low level signal in the wire identifying a negative voltage;
if the two input signals are 11, a fourth output terminal is configured to output high level signals in both the wire identifying a positive voltage and the wire identifying a negative voltage.

4. The encoder according to claim 2, wherein the plurality of output terminals comprise three output terminals,
if the two input signals are 00, a first output terminal is configured to output low level signals in the wire identifying a positive voltage and the wire identifying a negative voltage;
if the two input signals are 01, a second output terminal is configured to output a low level signal in the wire identifying a positive voltage and a high level signal in the wire identifying a negative voltage;
if the two input signals are 10, a third output terminal is configured to output a high level signal in the wire identifying a positive voltage and a low level signal in the wire identifying a negative voltage.

5. An encoding method of the encoders according to claim 1, comprising the steps of:
in a time frame:
receiving two input signals simultaneously by the two input terminals; and
determining one of the plurality of output terminals that corresponds to the two input signals according to the two input signals and outputting signals through the wire identifying a positive voltage and the wire identifying a negative voltage of the output terminal.

6. The method according to claim 5, wherein the two input signals comprise two-bit binary data composed of 0 and/or 1, including 00, 01, 10 or 11.

7. The method according to claim 6, wherein the output terminals for the outputting signals, to which the two different input signals correspond, are different.

8. The method according to claim 7, wherein the plurality of output terminals comprise four output terminals, and the step of determining one output terminal that corresponds to the two input signals and outputting signals through the wire identifying a positive voltage and the wire identifying a negative voltage of the output terminal comprises:
if the two input signals are 00, outputting low level signals in both the wire identifying a positive voltage of a first output terminal and the wire identifying a negative voltage thereof;
if the two input signals are 01, outputting a low level signal in the wire identifying a positive voltage of a second output terminal and a high level signal in the wire identifying a negative voltage thereof;
if the two input signals are 10, outputting a high level signal in the wire identifying a positive voltage of a third output terminal and a low level signal in the wire identifying a negative voltage thereof; and
if the two input signals are 11, outputting high level signals in both the wire identifying a positive voltage of a fourth output terminal and the wire identifying a negative voltage thereof.

9. The method according to claim 7, wherein the plurality of output terminals comprise three output terminals, and the step of determining one output terminal that corresponds to the two input signals and outputting signals through the wire identifying a positive voltage and the wire identifying a negative voltage of the output terminal further comprises:
if the two input signals are 00, outputting low level signals in both the wire identifying a positive voltage of a first output terminal and the wire identifying a negative voltage thereof;
if the two input signals are 01, outputting a low level signal in the wire identifying a positive voltage of a second output terminal and a high level signal in the wire identifying a negative voltage thereof; and
if the two input signals are 10, outputting a high level signal in the wire identifying a positive voltage of a third output terminal and a low level signal in the wire identifying a negative voltage thereof.

* * * * *